United States Patent [19]

Presser

[11] 3,740,672

[45] June 19, 1973

[54] SEMICONDUCTOR CARRIER FOR MICROWAVE APPLICATIONS

[75] Inventor: Adolph Presser, Kendall Park, N.J.

[73] Assignee: RCA Corporation, New York, N.Y.

[22] Filed: Nov. 22, 1971

[21] Appl. No.: 200,693

[52] U.S. Cl.. 333/84 M, 317/101 CP, 174/DIG. 3, 317/234 G

[51] Int. Cl. ........................... H01p 3/08, H01l 1/16

[58] Field of Search ...................... 333/84 M, 84 R; 317/234 H, 234 G, 234 A, 101 CP; 174/DIG. 3, DIG. 5; 330/56; 340/174 BP, 174 GB; 29/626

[56] References Cited

UNITED STATES PATENTS

| | | | |
|---|---|---|---|
| 3,489,956 | 1/1970 | Yanai et al. | 317/234 G |
| 3,428,866 | 2/1969 | Chiou et al. | 317/234 G |
| 3,649,872 | 3/1972 | Garboushian | 317/234 G |
| 3,008,089 | 11/1961 | Uhlir, Jr. | 333/84 M |
| 3,324,224 | 6/1967 | Thibodeau | 317/234 A |
| 3,419,813 | 12/1968 | Kamnitsis | 333/84 M |
| 3,500,428 | 3/1970 | Allen | 333/84 M |
| 3,577,181 | 5/1971 | Belohoubek | 333/84 M |
| 3,626,259 | 12/1971 | Garboushian et al. | 174/DIG. 3 |

FOREIGN PATENTS OR APPLICATIONS

| | | | |
|---|---|---|---|
| 1,206,675 | 9/1970 | Great Britain | 330/56 |

*Primary Examiner*—Rudolph V. Rolinec
*Assistant Examiner*—Wm. H. Punter
*Attorney*—G. H. Bruestle, Donald S. Cohen and Sanford J. Asman

[57] ABSTRACT

A semiconductor carrier, having microstrip transmission means designed integrally into the carrier structure, includes a ground plane member of electrical and thermally conductive material having a notch therein extending continuously from two adjacent surfaces thereof. A microstrip transmission pedestal of thermally conductive material is mounted within the notch and has its upper surface partially covered with an electrically conductive film that is separated from the ground plane member. A semiconductor element, having at least two electrodes on its surface is mounted on the conductive-film on the upper surface of the pedestal. An input microstrip transmission section is mounted on an upper-surface of the ground plane member and extends to an edge of the notch. One semiconductor element electrode is electrically connected to the ground plane member and another electrode is electrically connected to the input microstrip section. The semiconductor carrier can be cascaded with an identical carrier for amplifier applications wherein the input microstrip transmission section of each carrier is dimensioned to obtain a desired gain over a large frequency band when loaded with an impedance necessary for optimum power output.

4 Claims, 6 Drawing Figures

SEMICONDUCTOR CARRIER FOR MICROWAVE APPLICATIONS

BACKGROUND OF THE INVENTION

The invention herein described was made in the course of or under a contract or subcontract thereunder with the Department of the Air Force.

The present invention relates to a semiconductor carrier, and more particularly, to a semiconductor carrier for cascaded microwave amplifiers with maximum power output for a desired gain.

Use of semiconductor elements, such as transistors, in electrical circuits that operate at high frequencies such as in the microwave range, has necessitated the development of carrier assemblies which permit the semiconductor elements to function properly in such circuits. One problem encountered in this development is that all microwave power transistors in linear class-A (forwardly biased transistors) applications are potentially unstable. For example, when used in an amplifier circuit, there are some positive real source and/or load impedance values which result in the transistor self-sustaining oscillation. To obtain maximum power output without oscillation, there exist load impedance values that are necessary for maximum power output for which the real part of the transistor input impedance becomes negative. This restricts the source impedance value in any given frequency range over which stable amplifier operation can be attained. Therefore when two amplifier stages are cascaded, the stability problems of the second stage are aggravated by possible negative real output impedances of the first stage.

It has been found that the ranges of stable amplifier operation, utilizing potentially unstable transistors, can be extended by cascading two amplifier stages wherein the output impedance of the first stage is the source impedance for the second stage or conversely the input impedance at the second stage is the load impedance for the first stage. The ultimate operational range is determined by the ability of the interstage network to accomplish optimum performance over a large bandwidth and still maintain stability. It was further found that the best stable broadband performance can be obtained by directly cascading two transistors, each held in a separate carrier.

Any carrier selected for direct cascading of transistors must meet certain criteria for the transistors to operate near their peak performance. For example, the carrier must be capable of quickly dissipating the heat generated by the transistor to keep it at a suitable operating temperature so as not to adversely affect the operating characteristics of the transistor. It is also important that the interconnections between the carrier and the transistor chip be as short as possible to minimize parasitic inductances and that the carrier provide for simple interconnection with microstrip circuits.

SUMMARY OF THE INVENTION

A semiconductor carrier includes a ground plane member of an electrically and thermally conductive material having a notch therein extending continuously from two adjacent surfaces thereof. A microstrip transmission pedestal of thermally conductive material is mounted within the notch and has its upper-surface partially covered with an electrically conductive-film that is separated from the ground plane member. A semiconductive element, having at least two electrodes on its surface, is mounted on the upper-surface conductive-film of the pedestal. An input transmission section is mounted on an upper surface of the ground plane member and extends to an edge of the notch. One semiconductor element electrode is electrically connected to the ground plane member and another electrode is electrically connected to the input microstrip section. The semiconductor carrier can be cascaded with an identical carrier for amplifier applications wherein the input microstrip transmission section of each carrier is dimensioned to obtain a desired gain over a large frequency band when loaded with the impedance necessary for optimum power output.

THE DRAWINGS

DETAILED DESCRIPTION

Figure 1:
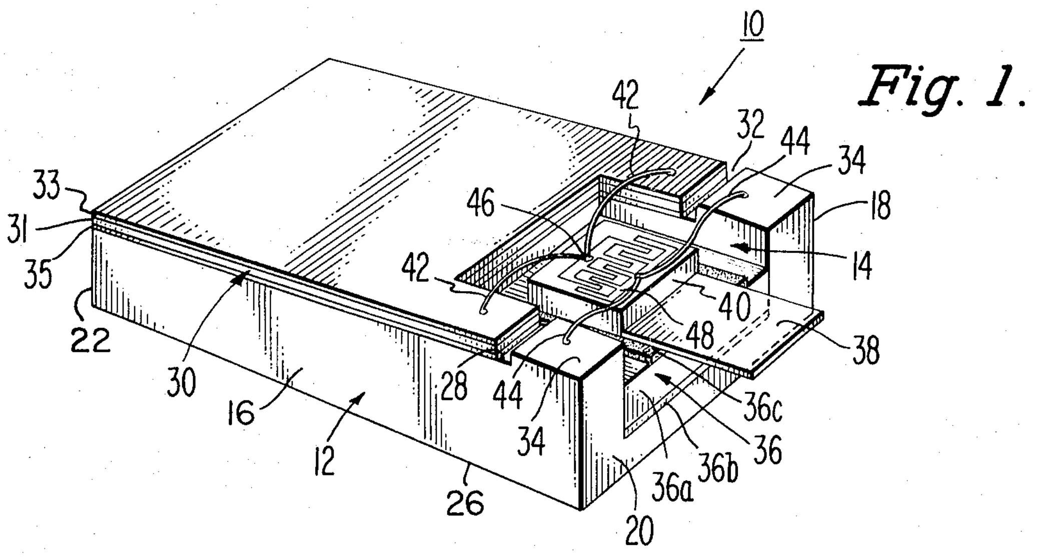
FIG. 1 is a perspective view of a semiconductor carrier.

A semiconductor carrier 10, in accordance with the present invention, is shown in FIG. 1. The carrier 10 has a metal ground plane member 12 that is machined from a rectangular parrallelepiped block of material having good thermal and electrical conductivity, such as copper-tungsten. A notch 14 is formed in member 12 centrally between the two sides 16 and 18 of member 12. The notch 14 opens upwardly and to the front of member 12 so that the member 12 appears to form a substantially squared U-shape around the notch 14 when viewed either vertically downwardly or horizontally toward the front end 20 of the member 12. Two of the sides of the notch 14 are parallel to the sides 16 and 18 of the member 12 and the remaining side is parallel to the back end 22 of the member 12. The bottom surface or shelf of the notch 14 is parallel to the bottom surface 26 of the member 12. A portion 28 of the upper surface of the member 12, starting approximately at the middle of the notch 14, is recessed and slopes downwardly toward the back end of the member. The entire ground plane member 12 is plated with a suitable conductive material such as with a 250 microinch layer of gold.

A flat input microstrip transmission section 30, of similar shape as the upper surface portion 28 is positioned on the surface portion 28. The length of the input microstrip transmission section 30 is slightly less than the length of the recessed surface portion 28 thereby leaving a gap 32 between the section 30 and the remaining horizontal upper surface portions 34 of the member 12. Preferably, the section 30 is constructed with a core 31 of material having good dielectric properites, such as alumina ($Al_2O_3$), and is covered by top and bottom layers 33 and 35, respectively, of a suitable conductive metal such as chromium-copper.

A microstrip transmission pedestal 36, of similar shape as the notch 14 but having a height shorter than the depth of the notch 14, is brazed onto the shelf of the notch 14. This pedestal is preferably constructed of a core 36*a* of material having good dielectric and heat conducting properties such as beryllium oxide (BeO) and is machined to fit tightly within the notch 14. The bottom surface and a portion of the top surface of the pedestal core 36*a* are covered with metal layers 36*b* and 36*c*, respectively, of suitable electrical conductive material, such as chromium-copper, to form another part of the carrier microwave transmission line. The top or upper layer 36*c* is spaced from the internal sides of notch 14 so as to not contact the ground plane member 12. A highly conductive flat output strip 38, preferably of silver, is affixed to the metal layer 36*c*, such as by brazing. This strip 38 extends beyond the front end 20 of the member 12 to provide an output terminal for contact either with an adjacent transistor carrier or with a circuit.

A semiconductor element, which is a transistor chip 40, can either be mounted over the pedestal 36 on the output strip 38 or directly to the metal layer 36*c*. In the later mounting position, the strip 38 is shorter and abuts the transistor chip 40. The transistor chip 40 is a flat body of a semiconductor material, such as silicon, having a pair of PN junctions formed therein which provide base 46, emitter 48 and collector regions. In FIG. 1, the collector is the bottom surface of the transistor chip 40 and is in direct contact with the output strip 38. Short wires 42 and 44 doubly connect the base 46 and the emitter 48 to the upper surface of the input microstrip transmission section 30 and to the upper surface portions 34 of ground plane member 12, respectively. The foregoing assembly is useful for common-base-amplifier configurations. It should be noted that common-emitter configurations are also possible by reversing the transistor chip.

Figure 2:
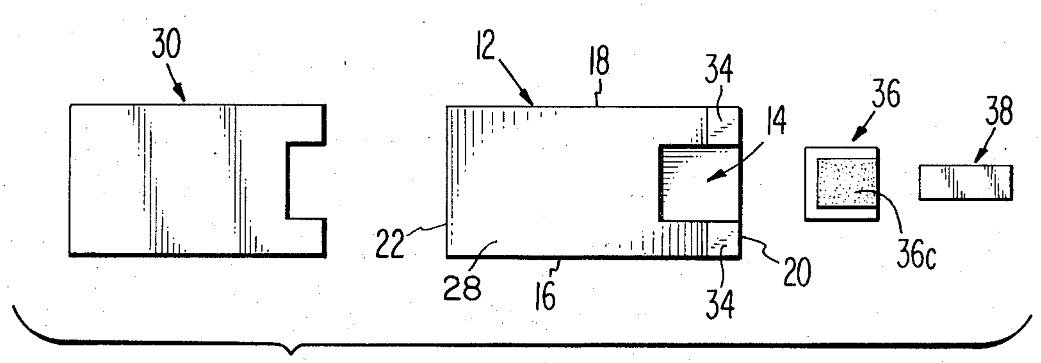
FIGS. 2, 3 and 4 are top plan views showing the sequential assembly of the semiconductor carrier of FIG. 1.
Figure 3:
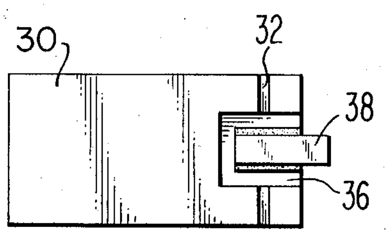
Figure 4:
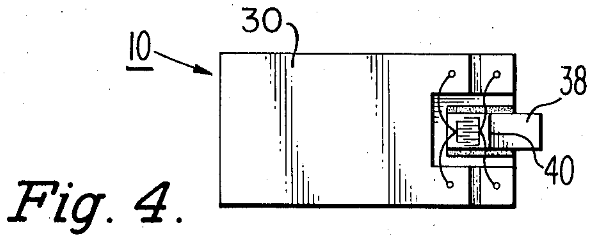

Assembly of the transistor carrier 10 is shown sequentially in FIGS. 2 through 4. Component parts of the carrier 10 are separated in FIG. 2 prior to placement of the input microstrip transmission section 30 on the member surface 28 and placement of the microstrip transmission pedestal 36 in the notch 14. FIG. 3 shows the semiconductor carrier 10 with the output strip 38 attached to the top of the pedestal 36. The semiconductor carrier 10 with a transistor chip 40 mounted thereon is shown in the vertical view of FIG. 4.

It should be noted that in the foregoing carrier, a portion of the input section 30, the surface portions 34 of the ground plane member 12 and the top of the transistor 40 are substantially coplanar. Because of this coplanarity, the wires 42 and 44 may be of a minimum length thereby virtually eliminating problems associated with inductance or resistance of such wires.

Figure 5:
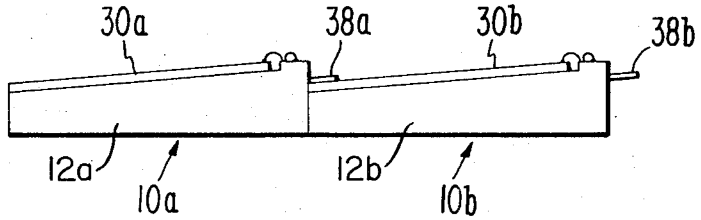
FIG. 5 is a side elevational view showing two semiconductor carriers in cascade.

Utilization of two transistor carriers, 10*a* and 10*b*, in a cascaded microwave class-A amplifier arrangement is shown in FIG. 5. In this cascaded arrangement, the front end of one carrier 10*a* abuts the back end of the second carrier 10*b* and the output strip 38*a* of the carrier 10*a* contacts the upper metal layer of the input section 30*b* of the adjacent carrier 10*b*.

In the cascaded arrangement, the base of one transistor is interconnected to the base of the other transistor through the two abutting carrier ground plane members 12*a* and 12*b*. Similarly, the collector of the first transistor is interconnected to the emitter of the second transistor through the output strip 38*a* and the input microstrip transmission section 30*b*. The cascaded arrangement can be integrated into a circuit by making appropriate connections between the circuit and the input section 30*a*, the output strip 38*b* and either or both ground plane members 12a or 12b.

It is known that the power output of a particular transistor is a function of its load impedance. For a given load impedance, the input impedance of the transistor itself is fixed and the transistor requires a precise source impedance to provide a specific gain. The linear gain and the linear power output of a transistor is limited by the power output capabilities (saturation) of the transistor. To reach a desired gain over a large frequency band with optimum power output, it is necessary to connect the transistors in series (cascade) so that each transistor is operated below its saturation level. The desired gain, therefore, is the sum of the individual transistor stage-gains. In such a cascaded arrangement, however, the input impedance of the second transistor becomes the load impedance of the first. Therefore, since the input impedance of the second transistor itself is fixed by its load impedance, something must be added between the input of the second transistor and the output of the first transistor to establish a required load impedance for the first transistor and a desirable source impedance for the second transistor. This function is served by the input microstrip transmission section 30 of the carrier 10. Utilizing the given variables, constants, and desired results the dimensions of the input microstrip transmission section can be calculated that provide optimum impedance. Such calculations make it possible to design an input microstrip transmission section that provides the required load impedance for the first transistor and the required source impedance for the second transistor. When identical transistors are used, the input microstrip transmission sections for each carrier can be designed to be identical. When so designed the two carriers in cascade are interchangeable.

Figure 6:
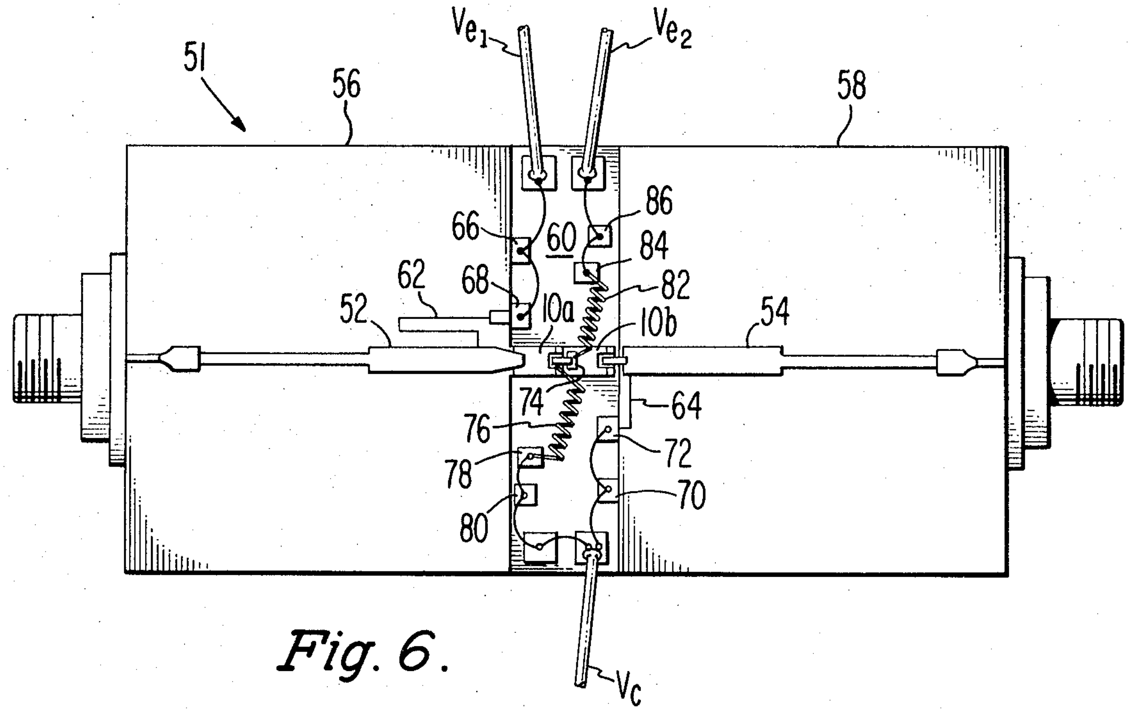
FIG. 6 is a top plan view of a two stage amplifier utilizing the two semiconductor carriers in cascade of FIG. 5.

The foregoing cascaded carrier arrangement was evaluated as a two stage linear class-A common-base configurated amplifier 51 in microstrip circuitry as shown in FIG. 6. This amplifier includes input and output sections 52 and 54 on ceramic substrates 56 and 58, respectively. The two ceramic substrates 56 and 58 are mounted on a conductive plate 60 that serves as ground for the amplifier 51. The two carriers 10*a* and 10*b* are mounted on the conductive plate 60 between substrates 56 and 58 in a cascaded relationship. Separate DC biasing $Ve_1$, $Ve_2$ and Vc are provided to each transistor through RF choke wires 62, 64, 76 and 82. Two RF-bypass capacitors, 66 and 68 for wire 62 and 70 and 72 for wire 64, are connected between each RF choke wire and the ground plate 60 to provide low and high frequency bypass, respectively. A capacitor 74 is positioned between the output strip 38*a* of the carrier 10*a* and the input section 30*b* of the carrier 10*b* to provide DC blocking between Vc and $Ve_2$. The side of the capacitor 74 toward the collector of the first transistor (i.e., output strip 38*a*) is connected to the bias Vc through the coiled choke wire 76. Two parallel capacitors 78 and 80 are connected between the wire 76 and the ground plate 60. Similarly, the other side of the capacitor 74, toward the emitter of the second transistor, is connected to bias $Ve_2$ through a coiled choke wire 82 which has two parallel capacitors 84 and 86 connected between the choke and ground.

Tests performed with the amplifier 51 using two transistor chips, manufactured by the RCA Corporation and designated TA-7487, indicated that the amplifier was capable of stable operation throughout a broad frequency range. Specific results yielded stable gain in excess of 10dB in the 1.6GHz to 3.1 GHz frequency range. Within this band, a gain in excess of 15dB was noted within the 1.8 GHz to 2.9 GHz range while a gain of 20dB was obtained in the 2.2 GHz to 2.8 GHz range. For comparison purposes, a single stage amplifier with the same transistor type yielded a gain of only 7dB over the 2.9 GHz to 3.2 GHz frequency range with similar linear power output.

In the foregoing amplifier, the disclosed carriers permit matching of two directly cascaded medium power transistors over a large bandwidth to obtain large gains and near optimum power output. This result is accomplished by the proper design of the transistor carriers whereby the source impedances of both transistors and the load impedance of the first transistor are established to obtain the desired gain and power output. Such impedances can be controlled by the appropriate construction of the identical input microstrip transmission sections 30*a* and 30*b*. In the aforementioend tests of the amplifier 51 using the TA-7487 transistor chips, the preferred dimensions for input microstrip transmission sections of 5.5 mil thick alumina having a dielectric constant of 10 are 60 mils wide and 80 mils long.

I claim:

1. A semiconductor carrier for microwave applications comprising:

a. a ground plane member of an electrically and thermally conductive material,
   said ground plane member being generally shaped like a rectangular parallelepiped with a top surface, a first end, and a second opposing end, said ground plane member having a notch extending therein from said top surface and said first end, and said top surface having a slanted portion extending from said second end to at least the edge of said notch;
b. a microstrip transmission pedestal of a thermally conductive material mounted on said ground plane member within said notch,
   said pedestal having an upper surface of an electrically conductive material which is separated from said ground plane member;
c. an input microstrip transmission section mounted on said slanted portion of said top surface of said ground plane member and extending from said second end of said ground plane member at least to said notch;

d. an output strip comprising a substantially flat piece of an electrically conductive material mounted on and electrically connected to said electrically conductive upper surface of said microstrip transmission pedestal, said output strip being substantially coplanar with and having a height slightly greater than does said top layer of said input microstrip transmission section at said second end of said ground plane member,
   said output strip extending outward from said notch, being substantially perpendicularly disposed to said first end, and having a length suitable for slidably interconnecting said semiconductor carrier to a second such semiconductor carrier;
e. a semiconductor element having a top surface and a bottom surface,
   said bottom surface being mounted on said microstrip transmission pedestal such that said semiconductor element is electrically and thermally connected to said electrically conductive upper surface of said microstrip transmission pedestal, and said top surface having at least two electrodes connected thereto; and
f. means electrically connecting one of said electrodes from said semiconductor element to said plane member and the other of said electrodes from said semiconductor element to said input microstrip transmission section.

2. The semiconductor carrier of claim 1 wherein said input microstrip transmission section is flat and comprises upper and lower metallic layers with a dielectric material sandwiched therebetween.

3. The semiconductor carrier of claim 2 in which said slanted portion of said top surface of said ground plane member is recessed such that said upper metallic layer of said input microstrip transmission section is substantially the same height as the nonslanted portions of said top surface of said ground plane member.

4. The semiconductor carrier of claim 1 in which said top surface of said semiconductor element is substantially coplanar with said top surface of said ground plane member.

* * * * *